(12) United States Patent
Kuge et al.

(10) Patent No.: US 9,114,935 B2
(45) Date of Patent: Aug. 25, 2015

(54) PLATE MEMBER CONVEYING APPARATUS AND METHOD OF CONVEYING PLATE MEMBER

(75) Inventors: Morimasa Kuge, Kobe (JP); Hideyuki Tanaka, Kobe (JP); Keiji Tsujita, Kobe (JP); Kazunori Takahara, Kobe (JP)

(73) Assignee: KAWASAKI JUKOGYO KABUSHIKI KAISHA, Kobe (JP)

( * ) Notice: Subject to any disclaimer, the term of this patent is extended or adjusted under 35 U.S.C. 154(b) by 0 days.

(21) Appl. No.: 14/238,269

(22) PCT Filed: Aug. 12, 2011

(86) PCT No.: PCT/JP2011/004569
§ 371 (c)(1),
(2), (4) Date: Feb. 27, 2014

(87) PCT Pub. No.: WO2013/024502
PCT Pub. Date: Feb. 21, 2013

(65) Prior Publication Data
US 2014/0216898 A1 Aug. 7, 2014

(51) Int. Cl.
*B65G 49/06* (2006.01)
*B65G 15/60* (2006.01)
*B65G 15/58* (2006.01)
*H01L 21/67* (2006.01)
*H01L 21/677* (2006.01)

(52) U.S. Cl.
CPC .............. *B65G 15/58* (2013.01); *B65G 49/064* (2013.01); *B65G 49/065* (2013.01); *H01L 21/67092* (2013.01); *H01L 21/67706* (2013.01); *B65G 2249/04* (2013.01); *B65G 2249/045* (2013.01)

(58) Field of Classification Search
None
See application file for complete search history.

(56) References Cited

U.S. PATENT DOCUMENTS

| 4,790,921 | A | * | 12/1988 | Bloomquist et al. ...... 204/192.12 |
| 6,422,377 | B1 | * | 7/2002 | Ulrich .......................... 198/689.1 |
| 7,222,727 | B2 | * | 5/2007 | Aisenbrey ................. 198/810.04 |
| 2013/0040541 | A1 | | 2/2013 | Mader et al. |

FOREIGN PATENT DOCUMENTS

| JP | A 2002-308423 | | 10/2002 |
| JP | 2006182563 A | * | 7/2006 |
| JP | A 2013-528544 | | 7/2013 |

* cited by examiner

*Primary Examiner* — Kavel Singh
(74) *Attorney, Agent, or Firm* — Oliff PLC

(57) ABSTRACT

The present invention provides a plate member conveying apparatus configured such that an occupied area is small, and a plate member is unlikely to be damaged. A plate member conveying apparatus according to the present invention includes a feed device having a conveying portion and a pressurizing portion. The conveying portion includes a belt configured to contact one of surfaces of a plate member in a vertical state to feed the plate member in a conveying direction. The pressurizing portion applies pressure of a fluid to the other surface of the plate member in the vertical state in a direction perpendicular to the surface of the plate member to press the plate member toward the belt. Then, the plate member in the vertical state is conveyed while being held by sandwiching the plate member between the belt of the conveying portion and the fluid of the pressurizing portion.

7 Claims, 5 Drawing Sheets

PLATE MEMBER CONVEYING APPARATUS AND METHOD OF CONVEYING PLATE MEMBER

TECHNICAL FIELD

The present invention relates to a plate member conveying apparatus and a method of conveying a plate member.

BACKGROUND ART

A plate member conveying apparatus is configured in accordance with the characteristics of a plate member to be conveyed. For example, in a machining line of plate glass (plate member) used for a TFT (thin film transistor) liquid crystal display, a conveying apparatus capable of conveying the plate glass without contacting one of surfaces of the plate glass is required. This is because since a thin film layer, such as a semiconductor, are formed on one of surfaces of the plate glass for the liquid crystal display, the formations of even minor scratches on this surface are unacceptable. Hereinafter, such a surface to be subjected to precision machining is called a "precision surface".

As the conveying apparatus configured to convey the plate glass without contacting the precision surface, an apparatus configured to cause a wagon to move in a conveying direction in a state where a surface (hereinafter referred to as a "normal surface") opposite to the precision surface of the plate glass is being sucked by a sucker provided at the wagon has already been put to practical use. However, in the case of this conveying apparatus, every time the plate glass is conveyed, the wagon needs to be returned to an initial position, so that it is difficult to efficiently operate this conveying apparatus. Also proposed are an apparatus configured to convey the plate glass in a state where the plate glass is mounted on a belt conveyor, and the normal surface faces downward, that is, the plate glass is in a horizontal state and an apparatus configured to convey the plate glass in a state where the plate glass is mounted on a belt conveyor, and the plate glass is in a standing state (see PTL 1, for example).

CITATION LIST

Patent Literature

PTL 1: Japanese Laid-Open Patent Application Publication No. 2002-308423

SUMMARY OF INVENTION

Technical Problem

However, the apparatus configured to convey the plate glass in the horizontal state is disadvantageous in that a large installation space needs to be secured depending on the size of the plate glass. In addition, the apparatus configured to mount the plate glass in the standing state on the belt conveyor is disadvantageous in that a lower end edge of the plate glass contacts the belt conveyor, and this may cause cracks from the lower end edge.

Here, an object of the present invention is to provide a plate member conveying apparatus that is small in occupied area and is unlikely to damage a plate member.

Solution to Problem

A plate member conveying apparatus according to one aspect of the present invention includes a feed device including a conveying portion and a pressurizing portion. The conveying portion includes a belt configured to contact one of surfaces of a plate member in a vertical state to feed the plate member in a conveying direction. The pressurizing portion applies pressure of a fluid to the other surface of the plate member in the vertical state in a direction perpendicular to the surface of the plate member to press the plate member toward the belt. Then, the plate member in the vertical state is conveyed while being held by sandwiching the plate member between the belt of the conveying portion and the fluid of the pressurizing portion.

According to this configuration, since the pressurizing portion presses the plate member in the vertical state toward the belt, the plate member is held so as to be sandwiched between the pressurizing portion and the conveying portion. Therefore, the plate member can be conveyed in a floating state without supporting the lower end of the plate member.

Advantageous Effects of Invention

As above, according to the plate member conveying apparatus of the present invention, since the plate member can be conveyed in the vertical state, the occupied area of the apparatus can be made small, so that space saving can be realized. In addition, since the plate glass is conveyed without being supported at a lower end thereof by a belt conveyor or the like, the plate glass is unlikely to be damaged.

DESCRIPTION OF EMBODIMENTS

Hereinafter, embodiments of the present invention will be explained in reference to the drawings. In the following explanations and drawings, the same reference signs are used for the same or corresponding components, and a repetition of the same explanation is avoided. A plate member conveying apparatus explained below conveys plate glass (plate member) having a precision surface and a normal surface. Herein, the "precision surface" denotes a surface that is subjected to precision machining and requires a higher degree of cleanliness than the "normal surface".

Embodiment 1

Figure 1:
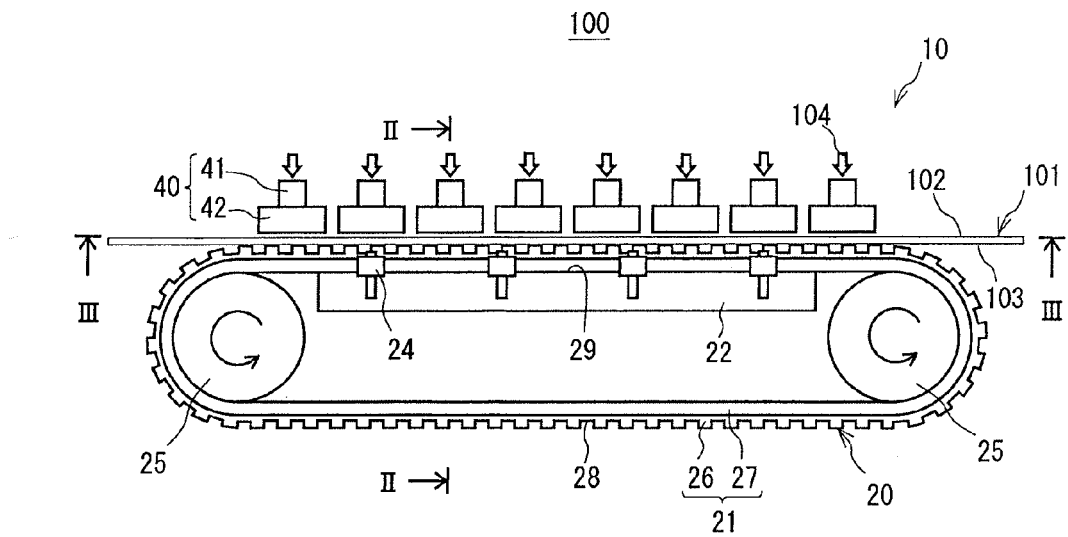
FIG. 1 is a plan view of a conveying apparatus according to Embodiment 1 of the present invention.

At first, a conveying apparatus 100 according to Embodiment 1 of the present invention will be explained in reference to FIGS. 1 to 3. FIG. 1 is a plan view of the conveying apparatus 100 according to the present embodiment. On the sheet of FIG. 1, a direction from a right side to a left side is referred to as a plate glass 101 conveying direction (hereinafter simply referred to as a "conveying direction"). A plate glass 101 in a vertical state is supplied to the conveying apparatus 100 from an upstream side that is the right side on the sheet of FIG. 1. As shown in FIG. 1, the conveying apparatus 100 according to the present embodiment includes a feed device 10. The feed device 10 is mainly constituted by a conveying portion 20 and a pressurizing portion 40.

The conveying portion 20 is a device configured to feed the plate glass 101 in the conveying direction. On the sheet of FIG. 1, a portion shown at a lower side of the plate glass 101 is the conveying portion 20. FIG. 2 is a cross-sectional view taken along line II-II of FIG. 1. An upper side on the sheet of FIG. 2 is an upper side of the conveying apparatus 100, and a direction from a far side on the sheet of FIG. 2 to a near side on the sheet of FIG. 2 is the conveying direction. As shown in FIGS. 1 and 2, the conveying portion 20 includes an endless belt 21, a belt receiving member 22, a lower end guide member 23, and an upper end guide member 24.

The endless belt 21 is a belt formed in a circular shape. The endless belt 21 is driven by two driving pulleys 25 respectively located at a conveying direction front side and rear side. The endless belt 21 is configured to contact a normal surface 103 of the plate glass 101 and can feed the plate glass 101 in the conveying direction by causing the driving pulleys 25 to rotate in a state where the endless belt 21 contacts the plate glass 101. The endless belt 21 according to the present embodiment is mainly constituted by a rubber belt portion 26 made of rubber and a metal belt portion 27 made of metal and has a double-layer structure. The rubber belt portion 26 and the metal belt portion 27 are joined to each other to constitute the endless belt 21 as a unit.

The rubber belt portion 26 is located at an outer surface side of the endless belt 21 and contacts the plate glass 101. The metal belt portion 27 is located at an inner surface side of the endless belt 21 and contacts the driving pulleys 25. As shown in FIG. 2, a belt width (upper-lower direction size) of the metal belt portion 27 is slightly larger than that of the rubber belt portion 26. A lower end and upper end of the metal belt portion 27 are respectively located at an upper-lower direction outer side of a lower end and upper end of the rubber belt portion 26. The metal belt portion 27 is high in stiffness and prevents the endless belt 21 from bending by its own weight.

A plurality of fluid discharge grooves 28 each extending in an upper-lower direction from an upper end to a lower end in a belt width direction are formed on an outer surface of the rubber belt portion 26 so as to be spaced apart from one another in a circumferential direction of the circular endless belt 21 at predetermined intervals. Herein, the "circumferential direction" denotes an extending direction of the endless belt 21, in other words, a proceeding direction of the endless belt 21. The fluid discharge groove 28 is formed vertically but may be formed so as to incline relative to a vertical direction. With this, even in a case where a liquid, such as water or a cleaning liquid, has flowed into between the plate glass 101 and the rubber belt portion 26, the liquid is discharged downward through the fluid discharge grooves 28. With this, the liquid can be prevented from remaining between the endless belt 21 and the plate glass 101, and therefore, the plate glass 101 can be prevented from slipping on the endless belt 21. In the present embodiment, to prevent water, discharged from the below-described pressurizing portion 40, from adhering to a part of the normal surface 103 and remaining as marks, the water is supplied to the normal surface 103 side of the plate glass 101.

The belt receiving member 22 is a member configured to support the endless belt 21. The belt receiving member 22 has a plate shape extending in the conveying direction. The belt receiving member 22 is located inside the endless belt 21 and arranged in parallel with a feed path through which the plate glass 101 moves. In other words, the belt receiving member 22 is arranged so as to be opposed to the feed path of the plate glass 101 with the endless belt 21 sandwiched therebetween. The belt receiving member 22 includes a flat belt receiving surface 29 contacting the endless belt 21, and the endless belt 21 slides on the belt receiving surface 29. As above, according to the belt receiving member 22 of the present embodiment, the flat belt receiving surface 29 supports the endless belt 21. Therefore, for example, it is possible to suppress the occurrence of a phenomenon in which the endless belt 21 waves in a direction perpendicular to a belt surface, the phenomenon being caused when the endless belt 21 is supported by a roller or the like. On this account, the plate glass 101 can be conveyed stably.

The lower end guide member 23 is a member configured to support the endless belt 21 from below. As shown in FIG. 2, the lower end guide member 23 is a roller configured to rotate and have a rotating axis extending in a direction perpendicular to the conveying direction. A plurality of lower end guide members 23 are arranged in the vicinity of the feed path of the plate glass 101 along the feed path. The lower end guide members 23 are located at a lower side of the endless belt 21 and support a lower end of the metal belt portion 27. As above, the lower end guide members 23 support the entire endless belt 21 via the metal belt portion 27 having high stiffness and prevent the endless belt 21 from bending by its own weight. In the present embodiment, the lower end guide member 23 is a roller. However, the lower end guide member 23 is not limited to this. For example, instead of the roller, the lower end guide member 23 may be a plate-shaped member extending in the conveying direction. In this case, the lower end guide members 23 can support the endless belt 21 in such a manner that the metal belt portion 27 is supported by and slides on upper surfaces of the lower end guide members 23.

The upper end guide member 24 is a member configured to prevent the endless belt 21 from being displaced upward. As shown in FIG. 2, the upper end guide member 24 is a roller configured to rotate and have a rotating axis extending in a direction perpendicular to the conveying direction. A plurality of upper end guide members 24 are arranged in the vicinity of the feed path of the plate glass 101 such that the upper end guide members 24 and the lower end guide members 23 form pairs. The upper end guide members 24 are located at an upper side of the endless belt 21 and contact an upper end of the metal belt portion 27. Further, a downward force toward the endless belt 21 is applied to the upper end guide member 24 by a spring 30. With this configuration, the upper end guide members 24 always contact the endless belt 21. Since the upper end guide members 24 are configured as above, the upper end guide members 24 can press the endless belt 21 downward to prevent the endless belt 21 from being displaced upward. In a case where the endless belt 21 can be stably supported only by the lower end guide members 23, the conveying portion 20 does not have to include the upper end guide members 24.

The pressurizing portion 40 is a device configured to apply fluid pressure to the plate glass 101 in a direction perpendicular to the plate glass 101. In the present embodiment, a fluid (hereinafter referred to as a "pressurized fluid") 104 used when applying the fluid pressure to the plate glass 101 is water. However, the pressurized fluid 104 may be a cleaning liquid, the other liquid, or a gas, such as air. A plurality of pressurizing portions 40 are arranged in the conveying direction so as to be opposed to the endless belt 21 via the plate glass 101. FIG. 3 is a diagram taken along line of FIG. 1. As shown in FIGS. 1 to 3, the pressurizing portion 40 is mainly constituted by a columnar inflow member 41 and a rectangular plate shaped outflow member 42.

The inflow member 41 is a member configured as an inlet of the pressurized fluid 104. As shown in FIG. 2, an inlet passage 43 that opens on an end surface of the inflow member 41 is formed in the inflow member 41, the end surface being located at a side opposite to the outflow member 42 side. A fluid supply device, not shown, is connected to the inlet passage 43, and the pressurized fluid 104 is supplied through the inlet passage 43 to the inside of the inflow member 41. Further, a fluid storage 44 that opens on an end surface of the inflow member 41 is formed in the inflow member 41, the end surface being located on the outflow member 42 side. The fluid storage 44 can temporarily store the pressurized fluid 104 having flowed through the inlet passage 43. Therefore, for example, even in a case where the pressure of the pressurized fluid 104 supplied to the inlet passage 43 fluctuates, the pressurized fluid 104 can be supplied to the outflow member 42 in a state where the fluctuation amount of the pressure of the pressurized fluid 104 has been reduced by the fluid storage 44. That is, the fluid storage 44 serves as a damper.

The outflow member 42 is a member configured to discharge the pressurized fluid 104 to the plate glass 101. The outflow member 42 is located at a position closer to the feed path of the plate glass 101 than the inflow member 41 and is joined to the inflow member 41. An intermediate passage 45 that opens on a surface of the outflow member 42 is formed in the outflow member 42, the surface being located at the inflow member 41 side. The intermediate passage 45 is constituted by a small-diameter portion 46 and a large-diameter portion 47 that is larger in diameter than the small-diameter portion 46. With this, the pressurized fluid 104 having flowed through the fluid storage 44 of the inflow member 41 flows through the inside of the small-diameter portion 46 and the inside of the large-diameter portion 47 in this order. A discharge opening portion 48 that opens at the plate glass 101 feed path side is formed at the outflow member 42. As shown in FIG. 3, the discharge opening portion 48 is formed in a substantially rectangular shape when viewed from the plate glass 101 feed path side. The pressurized fluid 104 having flowed through the intermediate passage 45 flows into the discharge opening portion 48 to be discharged to a precision surface 102 of the plate glass 101. The outflow members 42 according to the present embodiment are separately configured for respective pressurizing portions 40 but may be configured integrally.

Figure 2:
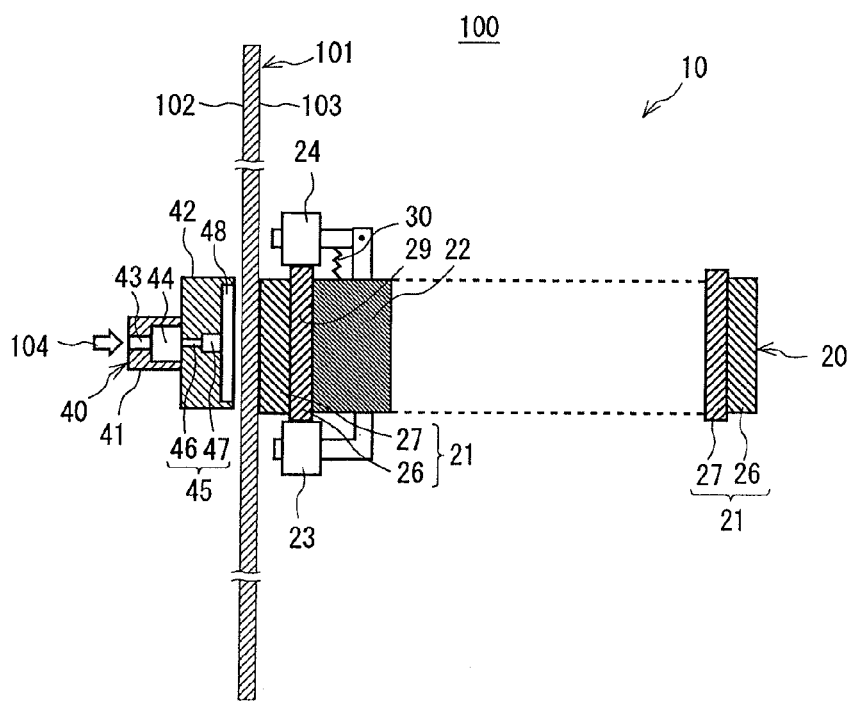
FIG. 2 is a cross-sectional view taken along line II-II of FIG. 1.
Figure 3:
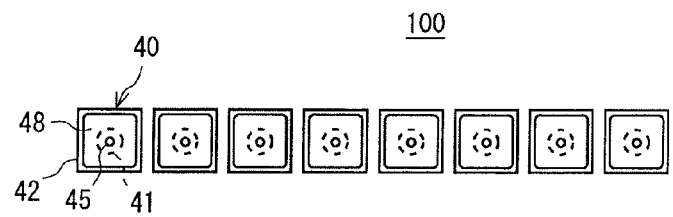
FIG. 3 is a cross-sectional view taken along line III-III of FIG. 1.

As shown in FIG. 2, the pressurizing portion 40 configured as above is arranged such that a small gap is formed between the pressurizing portion 40 and the plate glass 101 to be conveyed. With this, the pressurized fluid 104 discharged from the pressurizing portion 40 flows through the small gap between the pressurizing portion 40 and the plate glass 101 to flow out to the outside of the pressurizing portion 40. Thus, a film of the pressurized fluid 104 is formed between the pressurizing portion 40 and the plate glass 101. Therefore, the pressurizing portion 40 does not contact the plate glass 101, and the plate glass 101 can be pressed toward the endless belt 21 by the pressure of the pressurized fluid 104 in the direction perpendicular to the glass plate 101. Then, by increasing the pressure of the pressurized fluid 104, the plate glass 101 can be strongly held between the pressurizing portion 40 (pressurized fluid 104) and the conveying portion 20 and can be conveyed in a state where a lower end of the plate glass 101 is not supported.

According to the conveying apparatus 100 of the present embodiment, since the precision surface 102 of the plate glass 101 does not contact anything other than the fluid film, the degree of cleanliness of the precision surface 102 is maintained. In addition, since the plate glass 101 can be conveyed without supporting the lower end of the plate glass 101, the lower end edge of the plate glass 101 does not contact, for example, the belt conveyor. Therefore, the plate glass 101 is unlikely to be damaged. Further, the plate glass 101 can be conveyed in the vertical state. Therefore, even if the plate glass 101 to be conveyed is large, a large space for the installation of the conveying apparatus 100 is not required. That is, space saving can be realized.

Embodiment 2

Figure 4:
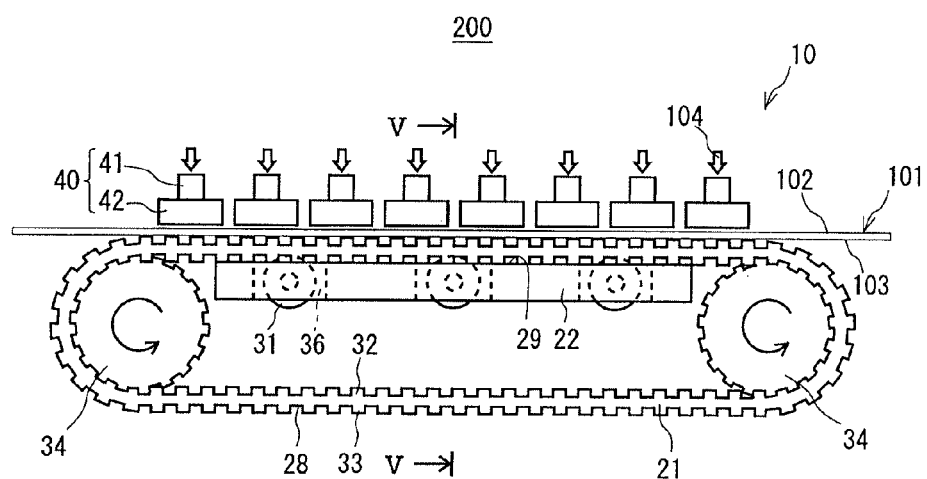
FIG. 4 is a plan view of the conveying apparatus according to Embodiment 2 of the present invention.
Figure 5:
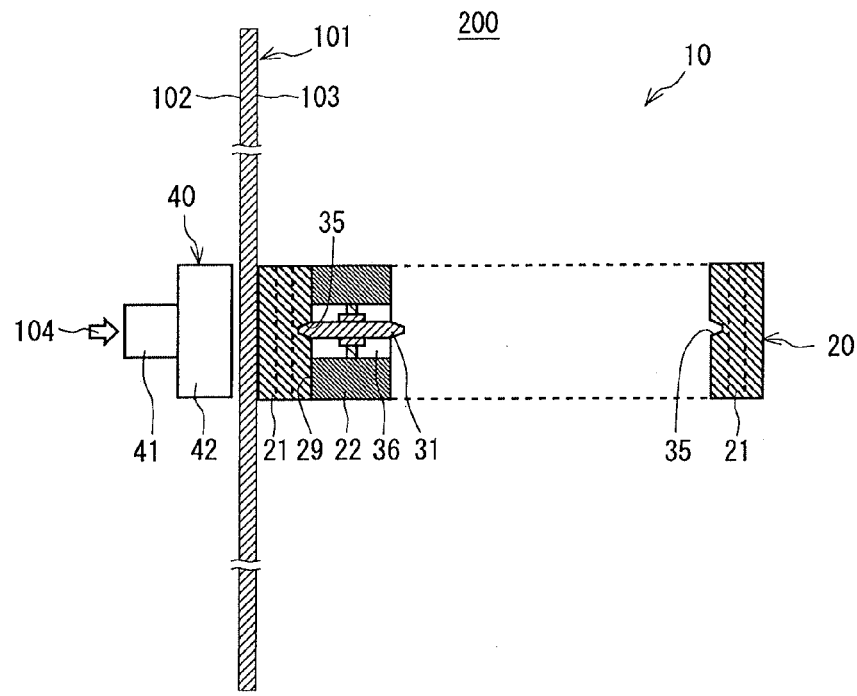
FIG. 5 is a cross-sectional view taken along line V-V of FIG. 4.

Next, a conveying apparatus 200 according to Embodiment 2 will be explained in reference to FIGS. 4 and 5. FIG. 4 is a plan view of the conveying apparatus 200 according to Embodiment 2. As shown in FIG. 4, the present embodiment is different from Embodiment 1 especially regarding the configuration of the conveying portion 20. The conveying portion 20 according to the present embodiment includes the endless belt 21, the belt receiving member 22, and a middle guide member 31. Since the pressurizing portion 40 of the present embodiment is the same as that of Embodiment 1, an explanation thereof is omitted.

The endless belt 21 is a double sided synchronous rubber belt having an inner surface and an outer surface on each of which teeth are formed. The endless belt 21 of the present embodiment does not have the double-layer structure unlike Embodiment 1 and does not include the metal belt portion 27 (see FIG. 1). Teeth 32 formed on the inner surface of the endless belt 21 and teeth 33 (portions each located between the adjacent fluid discharge grooves 28) formed on the outer surface of the endless belt 21 are arranged at the same intervals. The endless belt 21 is driven by two driving gears 34 located at a front side and rear side in the conveying direction. The driving gear 34 includes teeth that mesh with the teeth 32 formed on the inner surface of the endless belt 21. FIG. 5 is a cross-sectional view taken along line V-V of FIG. 4. As shown in FIG. 5, a guide groove 35 is formed on the inner surface of the endless belt 21 over the entire periphery so as to cross the teeth 32 (see FIG. 4) formed on the inner surface of the endless belt 21. The below-described middle guide member 31 is inserted into the guide groove 35.

As with Embodiment 1, the belt receiving member 22 includes the belt receiving surface 29. Tip ends of the teeth 32 formed on the inner surface of the endless belt 21 slide on the belt receiving surface 29. Further, a plurality of accommodating portions 36 configured to respectively accommodate the below-described middle guide members 31 are formed at the belt receiving member 22. Each of the accommodating portions 36 penetrates the belt receiving member 22 from the belt receiving surface 29 of the belt receiving member 22 to an opposite surface thereof. That is, the accommodating portion 36 is formed in a tunnel shape.

The middle guide member 31 is a member configured to support the endless belt 21. The middle guide member 31 has a disc shape and is configured to rotate and have a rotating axis extending in the upper-lower direction. As described above, the middle guide members 31 are inserted into the guide groove 35 formed on the endless belt 21. With this, the middle guide members 31 can support the endless belt 21 while rotating. Therefore, the endless belt 21 can be prevented from bending by its own weight. The conveying portion 20 of the conveying apparatus 200 according to the present embodiment does not include the lower end guide members 23 and the upper end guide members 24 (see FIG. 2) but includes the middle guide members 31 instead. This is because since the endless belt 21 of the present embodiment does not include the metal belt portion 27 (see FIG. 2) having high stiffness, it is difficult to support the endless belt 21 at its lower end.

According to the conveying apparatus 200 of the present embodiment, the degree of cleanliness of the precision surface 102 of the plate glass 101 can be maintained, and the plate glass 101 is unlikely to be damaged. In addition, a large space for the installation of the conveying apparatus 200 is not required, and space saving can be realized. In the conveying apparatus 200 according to the present embodiment, the teeth 32 formed on the inner surface of the endless belt 21 and the teeth 33 formed on the outer surface of the endless belt 21 are arranged at the same intervals. However, the endless belt 21 is not limited to this. To be specific, the teeth 33 on the outer surface and the teeth 32 on the inner surface may be formed at different intervals and may have different shapes. This is because the teeth 33 on the outer surface are formed by forming the fluid discharge grooves 28 whereas the teeth 32 on the inner surface are formed so as to mesh with the driving gear 34, so that the teeth 32 and 33 are different in technological significance from each other.

Embodiment 3

Figure 6:
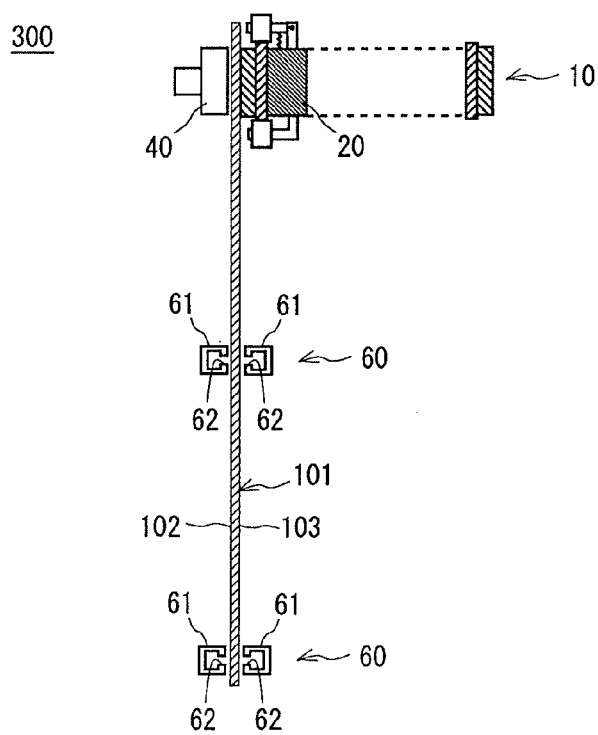
FIG. 6 is a longitudinal sectional view of the conveying apparatus according to Embodiment 3 of the present invention.

Next, a conveying apparatus 300 according to Embodiment 3 will be explained in reference to FIGS. 6 to 10. FIG. 6 is a longitudinal sectional view of the conveying apparatus 300 according to the present embodiment. The conveying apparatus 300 according to the present embodiment is different from the conveying apparatus 100 according to Embodiment 1 and the conveying apparatus 200 according to Embodiment 2 in that the conveying apparatus 300 according to the present embodiment includes fluid guide devices 60 in addition to the feed device 10.

The fluid guide device 60 is a device configured to apply fluid pressure to both surfaces of the plate glass 101 in a direction perpendicular to the surfaces to suppress horizontal oscillations of the plate glass 101. The fluid guide device 60 is constituted by a pair of passage pipes 61. The pair of passage pipes 61 are respectively arranged at both sides of the feed path of the plate glass 101 so as to be opposed to each other and extend in the conveying direction of the plate glass 101. A plurality of ejection ports 62 are formed on a portion of the passage pipe 61 at predetermined intervals, the portion being opposed to the plate glass 101. Further, water that is the pressurized fluid 104 flows inside each passage pipe 61. By increasing the pressure of the pressurized fluid 104, the pressurized fluid 104 is ejected from the ejection ports 62 to the plate glass 101 in the direction perpendicular to the plate glass 101. Therefore, according to the fluid guide device 60, the pressure of the pressurized fluid 104 in the perpendicular direction can be applied to both surfaces of the plate glass 101 without allowing machines and the like to contact the plate glass 101. Thus, the horizontal oscillations of the plate glass 101 can be prevented.

The configuration of the fluid guide device 60 is not limited to the above-explained configuration. For example, as the fluid guide device 60, the pressurizing portions 40 of the feed device 10 described above may be respectively arranged at both sides of the feed path of the plate glass 101 so as to be opposed to each other. The passage pipes 61 respectively arranged at both sides of the plate glass 101 do not have to be opposed to each other. To be specific, as long as the forces respectively applied to both surfaces of the plate glass 101 to be conveyed are balanced, the passage pipe 61 at the precision surface 102 side of the plate glass 101 and the passage pipe 61 at the normal surface 103 side of the plate glass 101 may be respectively arranged at positions that are different in the upper-lower direction from each other. Depending on the situation, the number of passage pipes 61 at the precision surface 102 side of the plate glass 101 and the number of passage pipes 61 at the normal surface 103 side of the plate glass 101 may be different from each other.

As shown in FIG. 6, in the conveying apparatus 300 according to the present embodiment, the feed device 10 is arranged in the vicinity of the upper end of the plate glass 101, and the fluid guide devices 60 are respectively arranged in the vicinity of the middle and lower end of the plate glass 101. In the case of conveying the plate glass 101 without supporting the plate glass 101 by the feed device 10, a portion, spaced apart from the feed device 10, of the plate glass 101 is easily displaced (easily causes the horizontal oscillations) in a direction perpendicular to the conveying direction. However, since the fluid guide device 60 is arranged at a position that is different in the upper-lower direction from the position of the feed device 10, the horizontal oscillations of the plate glass 101 can be reduced, and the plate glass 101 can be conveyed more stably.

Figure 7:
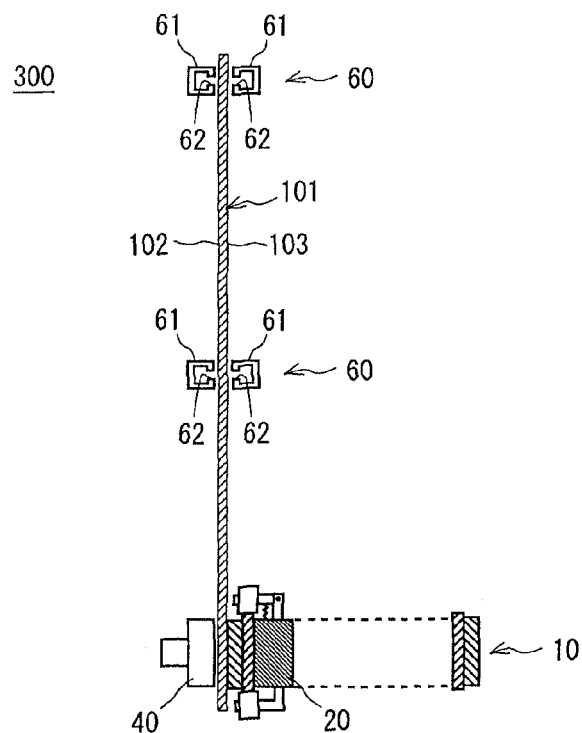
FIG. 7 is a longitudinal sectional view of the conveying apparatus according to Modification Example 1 of Embodiment 3.
Figure 8:
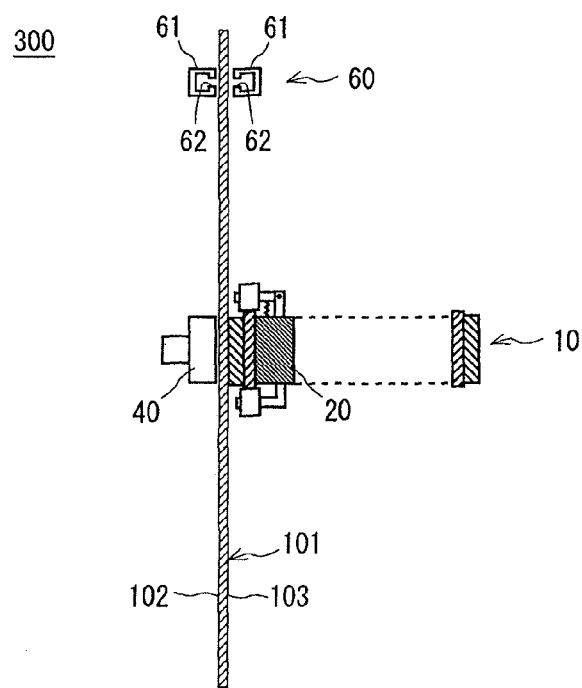
FIG. 8 is a longitudinal sectional view of the conveying apparatus according to Modification Example 2 of Embodiment 3.
Figure 9:
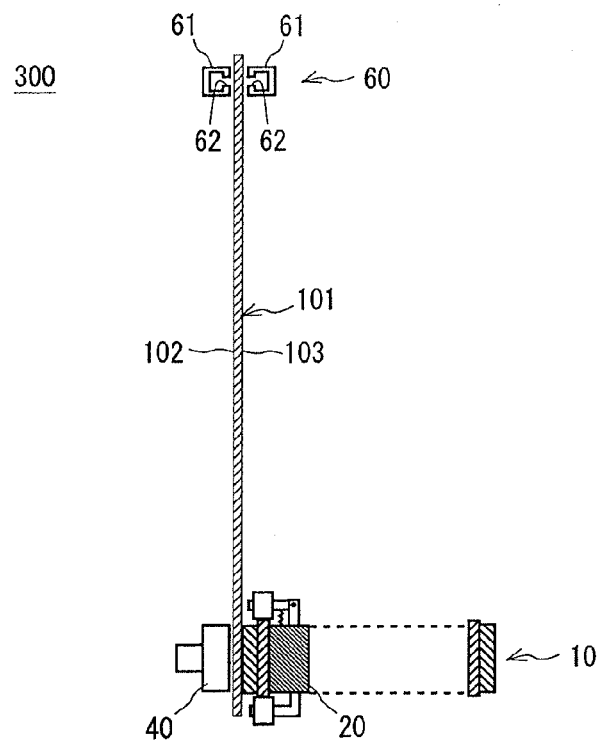
FIG. 9 is a longitudinal sectional view of the conveying apparatus according to Modification Example 3 of Embodiment 3.
Figure 10:
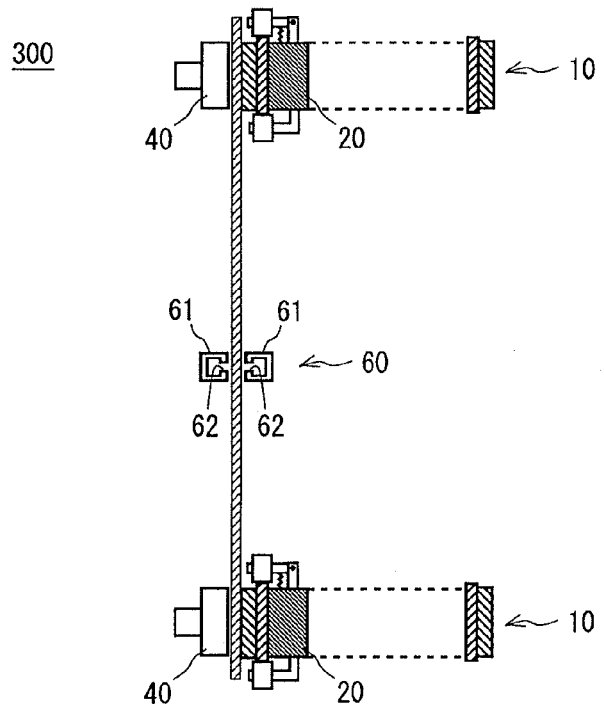
FIG. 10 is a longitudinal sectional view of the conveying apparatus according to Modification Example 4 of Embodiment 3.

The positions of the feed device 10 and the fluid guide devices 60 are not limited to those shown in FIG. 6. For example, the feed device 10 and the fluid guide device 60 may be arranged as shown in FIGS. 7 to 10. FIGS. 7 to 10 are longitudinal sectional views of the conveying apparatuses 300 according to Modification Examples 1 to 4 of the present embodiment. In Modification Example 1, as shown in FIG. 7, the feed device 10 is arranged in the vicinity of the lower end of the plate glass 101, and the fluid guide devices 60 are respectively arranged in the vicinity of the middle and upper end of the plate glass 101. In Modification Example 2, as shown in FIG. 8, the feed device 10 is arranged in the vicinity of the middle of the plate glass 101, and the fluid guide device 60 is arranged in the vicinity of the upper end of the plate glass 101. In Modification Example 3, as shown in FIG. 9, the feed device 10 is arranged in the vicinity of the lower end of the plate glass 101, and the fluid guide device 60 is arranged in the vicinity of the upper end of the plate glass 101. In Modification Example 4, as shown in FIG. 10, the feed devices 10 are respectively arranged in the vicinity of the lower end and upper end of the plate glass 101, and the fluid guide device 60 is arranged in the vicinity of the middle of the plate glass 101.

The foregoing has explained the embodiments of the present invention in reference to the drawings. However, specific configurations are not limited to these embodiments, and design modifications and the like within the spirit of the present invention are included in the present invention. The foregoing has explained a case where the plate glass 101 to be conveyed has the precision surface 102 and the normal surface 103. However, for example, both surfaces of the plate glass 101 to be conveyed may be the normal surfaces. Even in this case, the surfaces of the plate glass need to be kept clean, so that the plate member conveying apparatus according to the present invention is useful.

The foregoing has explained a case where the plate member conveying apparatus 100 according to the present embodiment conveys the plate glass. However, even if a certain device conveys a plate member other than the plate glass, this does not become a reason that this device is not included in the present invention. The foregoing has explained a case where the conveying apparatus 100 includes the circular endless belt 21. However, for example, a belt having a shape other than the circular shape may be used instead of the endless belt 21.

INDUSTRIAL APPLICABILITY

According to the plate member conveying apparatus of the present invention, the occupied area is small, and the plate member is unlikely to be damaged. Therefore, the present invention is useful in the technical field of the plate member conveying apparatus.

REFERENCE SIGNS LIST 10 feed device
20 conveying portion
21 endless belt (belt)
22 belt receiving member
23 lower end guide member
24 upper end guide member
26 rubber belt portion
27 metal belt portion
28 fluid discharge groove
29 belt receiving surface
31 middle guide member
35 guide groove
40 pressurizing portion
60 fluid guide device
100, 200, 300 conveying apparatus
101 plate glass (plate member)
102 precision surface
103 normal surface
104 pressurized fluid

The invention claimed is:

1. A plate member conveying apparatus comprising
a feed device including a conveying portion and a pressurizing portion, wherein:
the conveying portion includes a belt configured to contact one of surfaces of a plate member in a vertical state to feed the plate member in a conveying direction;
the pressurizing portion ejects a liquid to an other surface, which is opposite to the one surface, of the plate member in the vertical state to apply pressure in a direction perpendicular to the surface of the plate member and press the plate member toward the belt; and
the plate member in the vertical state is conveyed in a floating state while being held by sandwiching the plate member between the belt of the conveying portion and the liquid of the pressurizing portion.

2. The plate member conveying apparatus according to claim 1, wherein:
the fluid is a liquid; and
a plurality of fluid discharge grooves each extending in an upper-lower direction from an upper end of the belt to a lower end thereof are formed on an outer surface of the belt so as to be spaced apart from one another in a proceeding direction at predetermined intervals.

3. The plate member conveying apparatus according to claim 1, wherein:
the conveying portion includes a belt receiving member arranged in parallel with a feed path of the plate member; and
the belt receiving member includes a flat belt receiving surface on which an inner surface of the belt slides.

4. The plate member conveying apparatus according to claim 1, wherein:
the belt includes a rubber belt portion located at an outer surface side thereof and a metal belt portion located at an inner surface side thereof;
a lower end of the metal belt portion is located lower than a lower end of the rubber belt portion; and
the conveying portion includes a lower end guide member configured to support the lower end of the metal belt portion.

5. The plate member conveying apparatus according to claim 1, wherein:
a guide groove is formed on an entire inner surface of the belt; and
the conveying portion further includes a middle guide member that is inserted into the guide groove.

6. The plate member conveying apparatus according to claim 1, further comprising
a fluid guide device configured to apply pressure of a fluid to both surfaces of the plate member to suppress horizontal oscillations of the plate member, wherein
the fluid guide device is arranged at a position that is different in an upper-lower direction from a position of the feed device.

7. A method of conveying a plate member, comprising:
causing a belt to contact one of surfaces of the plate member in a vertical state, the belt being configured to feed the plate member in a conveying direction;
ejecting a liquid to an other surface of the plate member, which is opposite the one of surfaces, to apply pressure of the liquid to the other surface of the plate member and press the plate member toward the belt;
sandwiching the plate member between the belt and the liquid by the causing and applying steps to hold the plate member; and
conveying the plate member in a floating state.

* * * * *